US012538773B2

(12) United States Patent
Lee et al.

(10) Patent No.: US 12,538,773 B2
(45) Date of Patent: Jan. 27, 2026

(54) SEMICONDUCTOR STRUCTURE HAVING SELF-ALIGNED CONDUCTIVE STRUCTURE AND METHOD FOR FORMING THE SEMICONDUCTOR STRUCTURE

(71) Applicant: TAIWAN SEMICONDUCTOR MANUFACTURING COMPANY, LTD., Hsinchu (TW)

(72) Inventors: Shao-Kuan Lee, Hsinchu (TW); Cheng-Chin Lee, Hsinchu (TW); Cherng-Shiaw Tsai, Hsinchu (TW); Ting-Ya Lo, Hsinchu (TW); Chi-Lin Teng, Hsinchu (TW); Hsin-Yen Huang, Hsinchu (TW); Hsiao-Kang Chang, Hsinchu (TW); Shau-Lin Shue, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 864 days.

(21) Appl. No.: 17/461,155

(22) Filed: Aug. 30, 2021

(65) Prior Publication Data

US 2023/0063438 A1 Mar. 2, 2023

(51) Int. Cl.
*H01L 21/768* (2006.01)
*H01L 23/522* (2006.01)
*H01L 23/532* (2006.01)

(52) U.S. Cl.
CPC .. *H01L 21/76897* (2013.01); *H01L 21/76804* (2013.01); *H01L 21/76832* (2013.01); *H01L 23/5226* (2013.01); *H01L 21/7682* (2013.01); *H01L 21/76834* (2013.01); *H01L 21/76885* (2013.01); *H01L 23/53209* (2013.01); *H01L 23/53214* (2013.01); *H01L 23/53257* (2013.01); *H01L 23/53295* (2013.01)

(58) Field of Classification Search
None
See application file for complete search history.

(56) References Cited

U.S. PATENT DOCUMENTS

| 10,847,417 | B1 * | 11/2020 | Yao | H01L 23/5226 |
|---|---|---|---|---|
| 2017/0053863 | A1 * | 2/2017 | Lu | H01L 21/76843 |
| 2018/0233406 | A1 * | 8/2018 | Yeh | H01L 21/32135 |
| 2020/0098685 | A1 * | 3/2020 | Lee | H01L 23/5226 |

* cited by examiner

*Primary Examiner* — Sue A Purvis
*Assistant Examiner* — Carnell Hunter, III
(74) *Attorney, Agent, or Firm* — Birch, Stewart, Kolasch & Birch, LLP

(57) ABSTRACT

A method for making a semiconductor structure, including: forming a conductive layer; forming a patterned mask layer on the conductive layer; patterning the conductive layer to form a recess and a conductive feature; forming a first dielectric layer over the patterned mask layer and filling the recess with the first dielectric layer; patterning the first dielectric layer to form an opening; selectively forming a blocking layer in the opening; forming an etch stop layer to cover the first dielectric layer and exposing the blocking layer; forming on the etch stop layer a second dielectric layer; forming a second dielectric layer on the etch stop layer; patterning the second dielectric layer to form a through hole and exposing the conductive feature; and filling the through hole with an electrically conductive material to form an interconnect electrically connected to the conductive feature.

20 Claims, 23 Drawing Sheets

SEMICONDUCTOR STRUCTURE HAVING SELF-ALIGNED CONDUCTIVE STRUCTURE AND METHOD FOR FORMING THE SEMICONDUCTOR STRUCTURE

BACKGROUND

The semiconductor integrated circuit (IC) industry has over the past decades experienced tremendous advancements and is still experiencing vigorous development. With the dramatic advances in IC design, new generations of ICs have smaller and more complex circuits. Damascene process, such as single damascene or dual damascene, is one of the techniques used for forming BEOL (back-end-of-line) interconnect structures. The interconnect structures play an important role in miniaturization and electrical performance of the new generations of ICs. Thus, the industry pays much attention on development of the interconnect structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
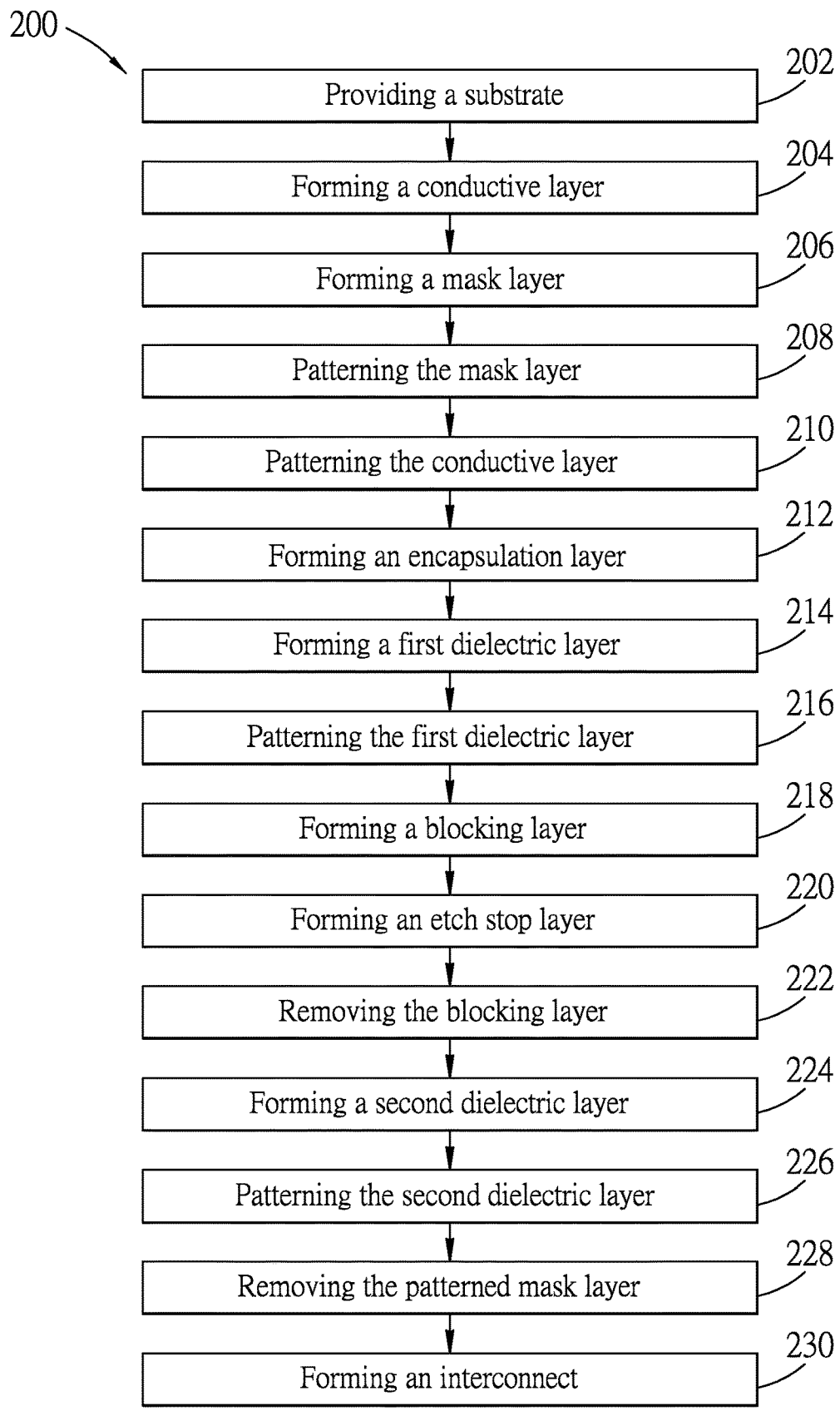
FIG. 1 illustrates a process flow for making a semiconductor structure in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 2 to 11 illustrate schematic views of intermediate steps in the formation of a semiconductor structure in accordance with some embodiments. The corresponding processes are also reflected in the flow chart 200 as shown in FIG. 1.

Figure 2:
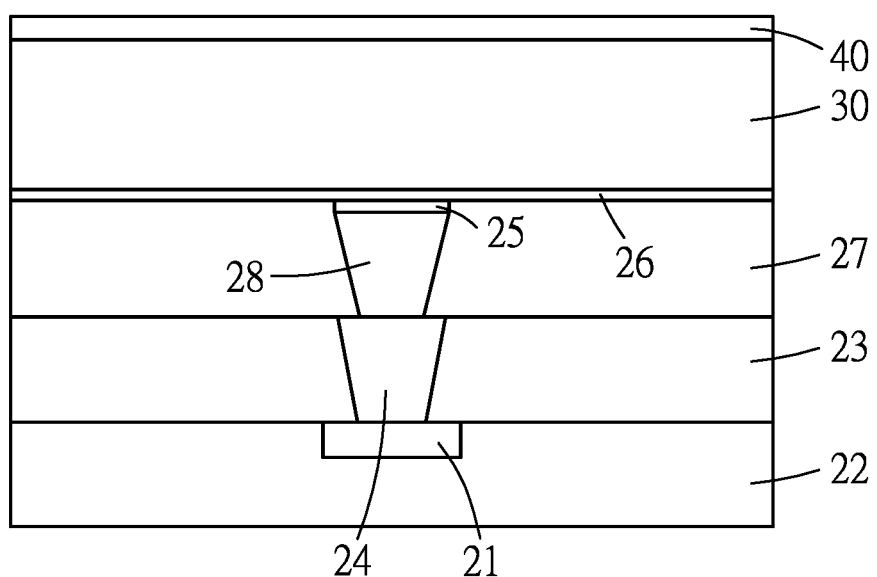
FIGS. 2 through 11 illustrate schematic views of stages in the formation of a semiconductor structure in accordance with some embodiments.

As shown in FIG. 2, in accordance with some embodiments, a substrate 22 is provided. This process is illustrated as process 202 in the flow chart 200 shown in FIG. 1. In some embodiments, the substrate 22 may be a semiconductor substrate, e.g., an elemental semiconductor or a compound semiconductor. An elemental semiconductor is composed of single species of atoms, such as silicon (Si) and germanium (Ge) in column 14 of the periodic table. A compound semiconductor is composed of two or more elements, such as silicon carbide (SiC), gallium arsenide (GaAs), gallium phosphide (GaP), indium phosphide (InP), indium arsenide (InAs), indium antimonide (InSb), silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), gallium indium arsenide phosphide (GaInAsP), or the like. The compound semiconductor may have a gradient feature in which the composition changes from one ratio at one location to another ratio at another location in the compound semiconductor. The compound semiconductor may be formed over a silicon substrate. The compound semiconductor may be strained. In some embodiments, the substrate 22 may include a multi-layer compound semiconductor structure. Alternatively, the substrate 22 may include a non-semiconductor material, such as a glass, fused quartz, or calcium fluoride. Furthermore, in some embodiments, the substrate 22 may be a semiconductor on insulator (SOI) (e.g., silicon germanium on insulator (SGOI)). Generally, an SOI substrate includes a layer of a semiconductor material such as epitaxial silicon (Si), germanium (Ge), silicon germanium (SiGe), or combinations thereof. The substrate 22 may be doped with a p-type dopant, such as boron (Br), aluminum (Al), gallium (Ga), or the like, or may alternatively be doped with an n-type dopant, as is known in the art. In some embodiments, the substrate 22 may include a doped epitaxial layer. Shallow trench isolation (STI) regions (not shown) may be formed in the substrate 22 to isolate active regions (one is schematically shown in FIG. 2 with the numeral 21), such as source or drain regions of an integrated circuit device (not shown) in the substrate 22. In some embodiments, the integrated circuit device may include transistors (e.g., field-effect transistors (FETs), complementary metal-oxide semiconductor (CMOS) transistors, planar or vertical multi-gate transistors (e.g., FinFET devices), gate-all-around (GAA) devices, or the like), resistors, capacitors, diodes, interconnections, or the like, based on practical applications. In addition, through-vias (not shown) may be formed to extend into the substrate 22 for electrically connecting features on opposite sides of the substrate 22.

In accordance with some embodiments, a dielectric layer 23 is formed over the substrate 22, and a contact feature 24 is formed in the dielectric layer 23 and is electrically connected to the active region 21.

In accordance with some embodiments, a dielectric layer 27 is formed over the dielectric layer 23, and a conductive structure 28 is formed in the dielectric layer 27 and is electrically connected to the contact feature 24. In some embodiments, the conductive structure 28 may be a metal interconnect line, and may optionally include a capping layer 25. In some embodiments, the capping layer 25 may be made of copper (Cu), cobalt (Co), ruthenium (Ru), molybdenum (Mo), chromium (Cr), tungsten (W), manganese (Mn), rhodium (Rh), iridium (Ir), nickel (Ni), lead (Pb), platinum (Pt), silver (Ag), gold (Au), aluminum (Al), or alloys thereof, or the like. In some embodiments, the capping layer 25 may be deposited by suitable techniques, such as physical vapor deposition (PVD), chemical vapor deposition (CVD), atomic layer deposition (ALD), or the like. In some embodiments, the capping layer 25 has a thickness not greater than about 3 nm. In some embodiments, the conductive structure 28 is a metal layer, and may be made of copper (Cu), cobalt (Co), tungsten (W), ruthenium (Ru), molybdenum (Mo), aluminum (Al), or the like. In some embodiments, the conductive structure 28 may be formed by PVD, CVD, ALD, electroless deposition (ELD), a combination of PVD and electrochemical plating (ECP), or the like.

In accordance with some embodiments, a glue layer 26 may be formed on the dielectric layer 27 by a suitable technique, such as PVD, CVD, or the like. In some embodiments, the glue layer 26 may be made of a conductive material of titanium (Ti), tantalum (Ta), titanium nitride (TiN), tantalum nitride (TaN), combinations thereof, or the like. In some embodiments, the glue layer 26 may have a thickness not greater than about 3 nm.

In accordance with some embodiments, subsequent to the optional formation of the glue layer 26, a conductive layer 30 (e.g., a metal layer or the like) is formed over the substrate 22. This process is illustrated as process 204 in the flow chart 200 shown in FIG. 1. In some embodiments, the conductive layer 30 is a metal layer, and may be made of copper (Cu), cobalt (Co), tungsten (W), ruthenium (Ru), molybdenum (Mo), aluminum (Al), or the like. In some embodiments, the conductive layer 30 may be formed by a suitable technique, such as PVD, CVD, ALD, ELD, a combination of PVD and ECP, or the like.

Subsequently, in accordance with some embodiments, a mask layer 40 is formed on the conductive layer 30. This process is illustrated as process 206 in the flow chart 200 shown in FIG. 1. The mask layer 40 may include multiple layers, each of which may include a metal, a metallic compound (e.g., a metal oxide, a metal nitride, a metal carbide, etc.), a dielectric (e.g., a semiconductor oxide, a semiconductor nitride, a semiconductor carbide, etc.), and/or other suitable materials. The mask layer 40 may be formed by any suitable process including CVD, (e.g., low pressure CVD (LPCVD), plasma enhanced CVD (PECVD), or the like), PVD, ALD, spin-on coating, and/or other suitable techniques, and may be formed to have any suitable thickness. In some embodiments, the mask layer 40 includes a nitride (e.g., TiN, TaN, silicon nitride (SiN), tungsten nitride (WN), etc.), a carbide (e.g., SiC, tungsten carbide (WC), etc.), and/or a metal oxide (e.g., titanium oxide, tantalum oxide, etc.).

Figure 3:
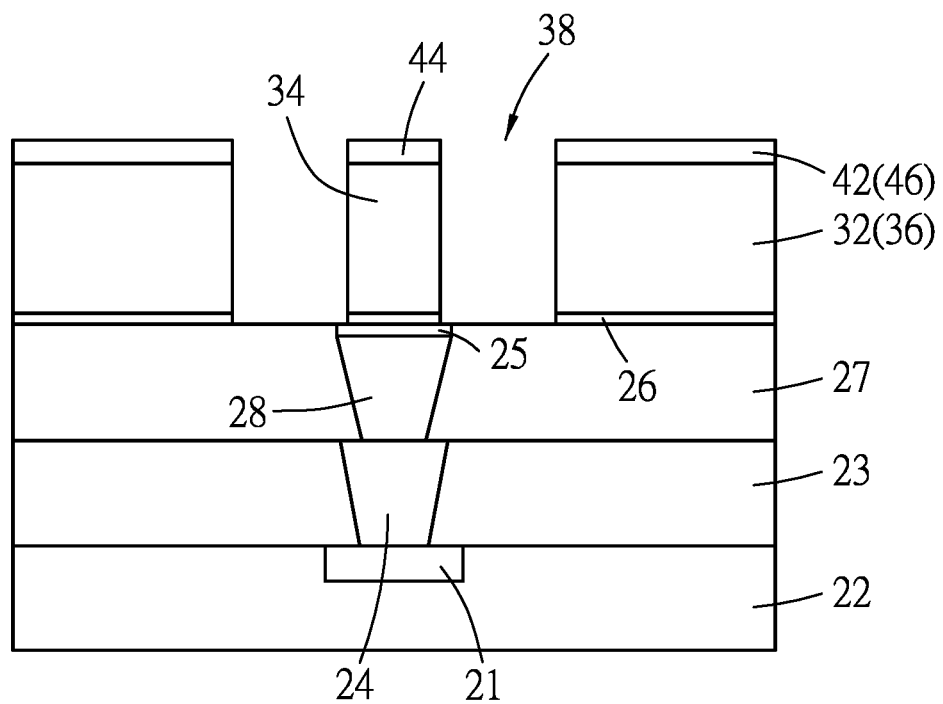

FIG. 3 illustrates the mask layer 40 (see FIG. 2) being patterned to form a patterned mask layer 42. This process is illustrated as process 208 in the flow chart 200 shown in FIG. 1. In accordance with some embodiments, the patterned mask layer 42 includes a first mask sub-layer 44 and a second mask sub-layer 46.

In accordance with some embodiments, a photoresist (not shown) may be used for patterning the mask layer 40 (see FIG. 2). The photoresist is formed on the mask layer 40, followed by patterning the photoresist according to a predetermined mask layout. The photoresist may include a photosensitive material which undergoes a property change when exposed to light. The property change may be used to selectively remove exposed or unexposed portions of the photoresist in a photolithographic patterning process. In some embodiments, a photolithographic system exposes the photoresist to radiation in a particular pattern determined by a mask. Radiation light passing through the mask strikes the photoresist to thereby transfer a pattern formed on the mask to the photoresist. In some embodiments, the photoresist is patterned using a direct writing or maskless lithographic technique, such as laser patterning, e-beam patterning, ion-beam patterning, or the like. After the exposure step, the photoresist is then developed, leaving the exposed portions of the photoresist, or in alternative examples, leaving the unexposed portions of the photoresist. In some embodiments, the patterning process may include multiple steps, such as soft baking of the photoresist, mask alignment, exposure, post-exposure baking, developing of the photoresist, rinsing, and drying (e.g., hard baking). Each of the steps may be repeated or omitted according to practical requirements. The patterned photoresist exposes portions of the mask layer 40 to be etched. In some embodiments, the etching process may include an anisotropic (i.e., directional) etching configured to etch vertically through the mask layer 40 without substantial horizontal etching. Accordingly, the etching process may include any suitable etching technique, such as dry etching, wet etching, reactive ion etching (RIE), ashing, or the like. The etching process may use any suitable etchant, and the particular etchant or etchants may depend on the materials of the mask layer 40 being used.

FIG. 3 further illustrates that, after the mask layer 40 (see FIG. 2) is patterned into the patterned mask layer 42, the conductive layer 30 (see FIG. 2) is patterned using the patterned mask layer 42 as a mask to form a patterned conductive layer 32. In accordance with some embodiments, the glue layer 26 is also patterned in this step. This process is illustrated as process 210 in the flow chart 200 shown in FIG. 1. In some embodiments, the patterned conductive layer 32 includes a first conductive feature 34, a second conductive feature 36 separated from the first conductive feature 34, and a recess 38 adjoining the first conductive feature 34 and the second conductive feature 36. In some embodiments, the recess 38 may be adjacent to the first conductive feature 34. In other embodiment, the recess 38 may surround the first conductive feature 34. In some embodiments, the first conductive feature 34 may be electrically connected to the second conductive feature 36. In other embodiments, the first conductive feature 34 may be not electrically connected to the second conductive feature 36. In some embodiments, the first conductive feature 34 is covered by the first mask sub-layer 44 of the patterned mask layer 42 and is electrically connected to the conductive feature 24 through the conductive structure 28, and the second conductive feature 36 is covered by the second mask sub-layer 46 of the patterned mask layer 42.

Figure 4:
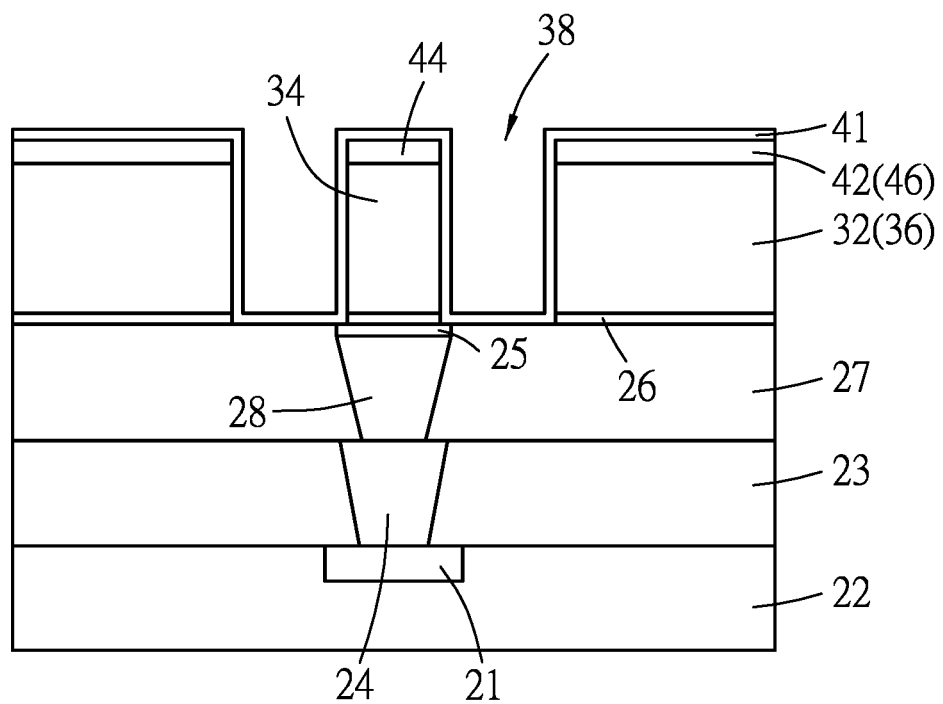

FIG. 4 illustrates that, after the conductive layer 30 (see FIG. 2) is patterned into the patterned conductive layer 32, an encapsulation layer 41 is formed. This process is illustrated as process 212 in the flow chart 200 shown in FIG. 1. In some embodiments, the encapsulation layer 41 covers the patterned mask layer 42 and surrounds the recess 38. In some embodiments, the encapsulation layer 41 is made of a suitable material, such as silicon oxycarbide (SiOC), SiN, aluminum oxide, aluminum nitride, combinations thereof, or the like. In some embodiments, the encapsulation layer 41 may be formed by a suitable technique, such as CVD, PEVCD, ALD, PEALD, or the like. In some embodiments, the encapsulation layer 41 is conformally deposited and has a thickness not greater than about 3 nm.

Figure 5:
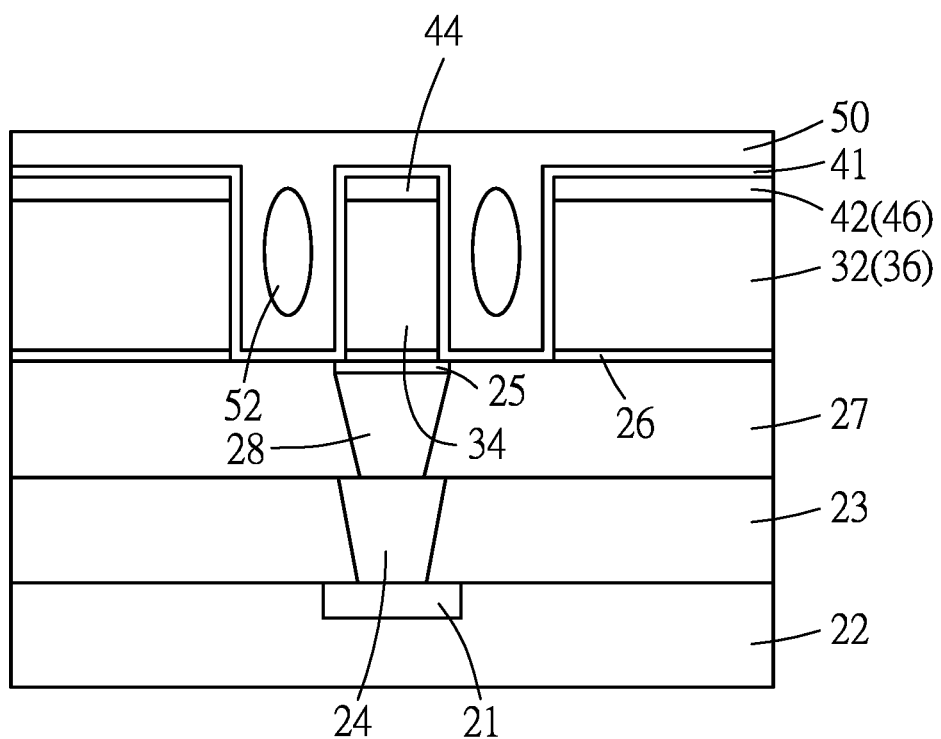

FIG. 5 illustrates that, after the formation of the encapsulation layer 41, a first dielectric layer 50 is formed to fill the recess 38 (see FIG. 4) and to cover the encapsulation layer 41. In some embodiments, the dielectric layer 50 in the recess 38 is formed with an air gap 52. This process is illustrated as process 214 in the flow chart 200 shown in FIG. 1. In some embodiments, the first dielectric layer 50 includes undoped silicate glass (USG), phosphosilicate glass (PSG), borosilicate glass (BSG), boron-doped phosphosilicate glass (BPSG), fluorine-doped silicate glass (FSG) silicon dioxide ($SiO_2$), SiOC-based materials (e.g., SiOCH), or the like. In some embodiments, silicon dioxide may be formed from tetraethyl orthosilicate (TEOS). The first dielectric layer 50 may be formed using a suitable technique, such as spin-on coating, flowable chemical vapor deposition (FCVD), PECVD, LPCVD, ALD, or the like.

Figure 6:
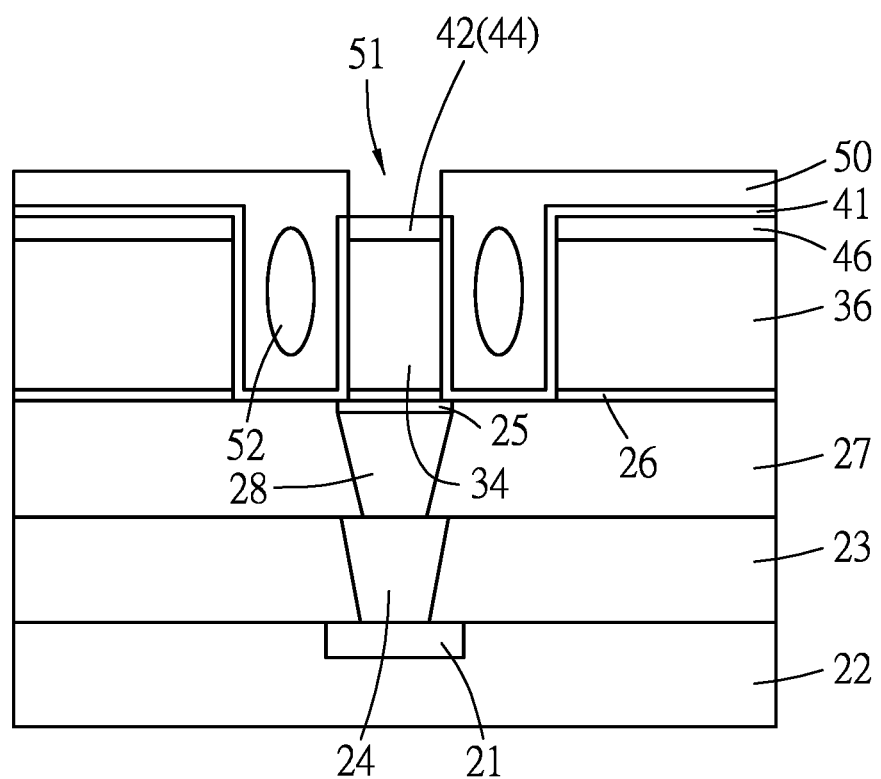

FIG. 6 illustrates that, after the formation of the first dielectric layer 50, the dielectric layer 50 is patterned. This process is illustrated as process 216 in the flow chart 200 shown in FIG. 1. In some embodiments, a part of the first dielectric layer 50 and a part of the encapsulation layer 41, which correspond in position to the first mask sub-layer 44, are removed by a suitable technique, such as directional plasma etching with a patterned etch mask (not shown) so as to form an opening 51 in the dielectric layer 50 (i.e., forming a patterned dielectric layer 50) and to expose the underlying first mask sub-layer 44 from the opening 51. In some embodiments, the first mask sub-layer 44 may also be etched away by the directional plasma etching or suitable techniques.

In accordance with some embodiments, after the dielectric layer 50 is patterned, an optional pre-clean process may be applied. The pre-clean process may be any pre-clean technique suitable for cleaning the exposed first mask sub-layer 44 of the patterned mask layer 42. In some embodiments, the pre-clean process involves exposing ozone ($O_3$) gas to UV light to decompose $O_3$ into $O_2$, oxygen free radicals, oxygen ions, which may react with contaminations (e.g., carbon-containing substances, such as CO group, $CH_2$ group, or the like). In other embodiments, the pre-clean process involves the application of a suitable wet cleaning solution, such as diluted HF or the like, followed by baking under nitrogen and hydrogen atmosphere.

Figure 7:
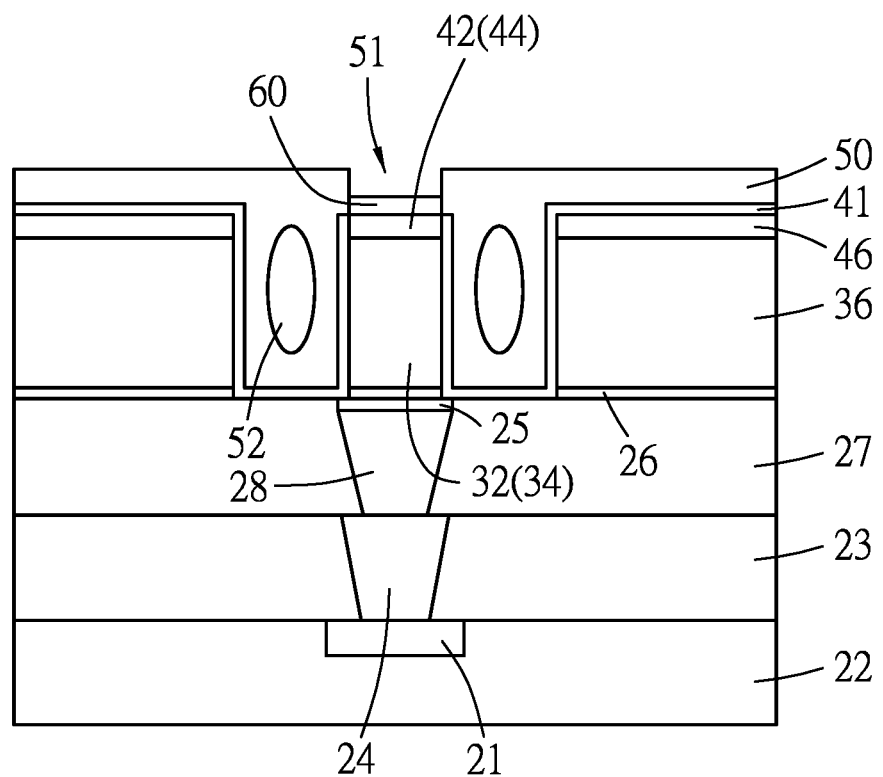

FIG. 7 illustrates that, after the patterning step, a blocking layer 60 is selectively formed in the opening 51 on the first mask sub-layer 44 and is not formed on the first dielectric layer 50. This process is illustrated as process 218 in the flow chart 200 shown in FIG. 1. In some embodiments, the blocking layer 60 may be formed from a self-assembling monolayer (SAM) material including a head group which contains phosphorus (P) or sulfur (S). In some embodiments, the head group of SAM may include phosphate or sulfate. In some embodiments, SAM may include benzotriazole (BTA), phosphonic acid, octadecylphosphonic (ODPA), organosulfur compound, thiol (e.g., dodecanethiol, alkanethiol, or the like), or the like. In some embodiments, SAM further includes a tail group which is connected to the head group and which contains an organic chain, such as CHx or the like. In some embodiments, the first mask sub-layer 44 may include hydroxyl surface group, which may be formed from reaction with moisture, and SAM may react with the hydroxyl group on the surface of the first mask sub-layer 44 to be selectively formed on the first mask sub-layer 44 and not formed on the first dielectric layer 50. The blocking layer 60 may be formed by a suitable technique, such as ALD, CVD, spin-on coating, dipping, or the like. In some embodiments, the first mask sub-layer 44 may be removed in the step of patterning the dielectric layer 50, and the blocking layer 60 may be selectively formed on the first conductive feature 34 and not formed on the first dielectric layer 50.

Figure 8:
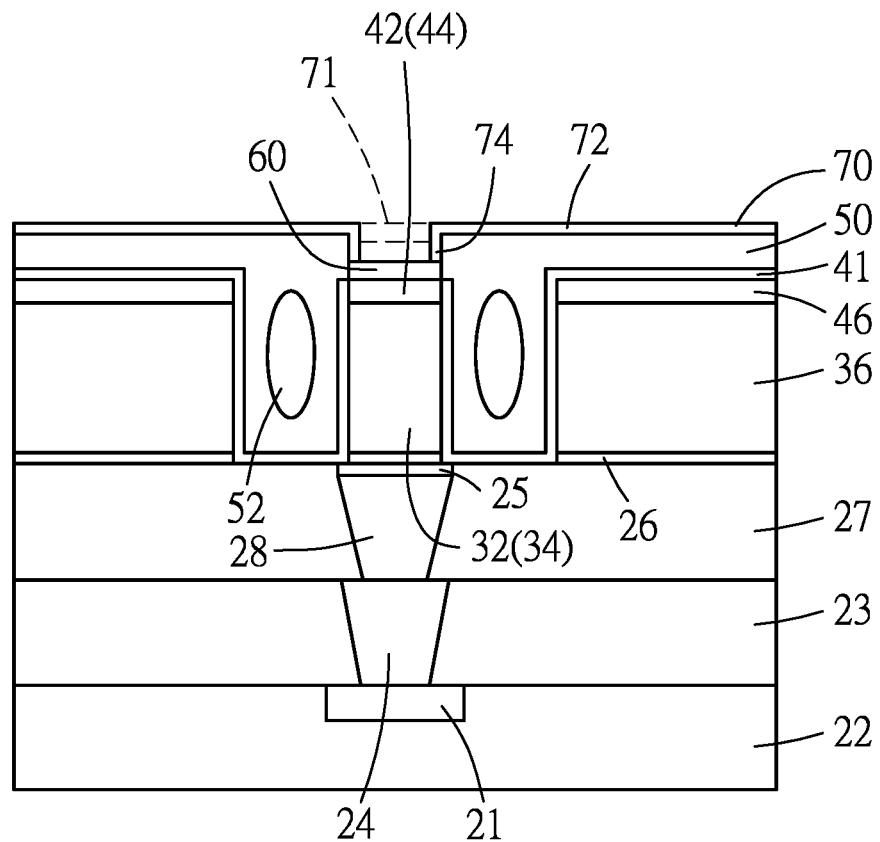

FIG. 8 illustrates that, after selective formation of the blocking layer 60, an etch stop layer 70 is selectively formed on the first dielectric layer 50 and is not formed on the blocking layer 60. This process is illustrated as process 220 in the flow chart 200 shown in FIG. 1. In some embodiments, the head group of SAM is configured to be hydrophilic, and the tail group of SAM is configured to be hydrophobic, which blocks absorption of a precursor of the etch stop layer 70 on SAM, thereby preventing the etch stop layer 70 from forming on the blocking layer 60. In some embodiments, the etch stop layer 70 has a first sub-layer 72 that is formed on a top surface of the first dielectric layer 50. In some other embodiments, the etch stop layer 70 further has a second sub-layer 74 that is formed on an inner lateral side of the first dielectric layer 50. In some embodiments, the etch stop layer 70 only has the first sub-layer 72 that is formed on the top surface of the first dielectric layer 50, and does not have the second sub-layer 74 that is formed on the inner lateral side of the first dielectric layer 50. In some embodiments, the first sub-layer 72 of the etch stop layer 70 has a horizontal cross section that is complementary in shape to that of the blocking layer 60. In some embodiments, the second sub-layer 74 of the etch stop layer 70 defines an opening 71 that has a horizontal cross section substantially conforming in shape to that of the first conductive feature 34. In some embodiments, horizontal cross sections of the blocking layer 60, the first mask sub-layer 44 of the patterned mask layer 42 and the first conductive feature 34 of the patterned conductive layer 32 are substantially the same. In some embodiments, the etch stop layer 70 may be made of a material selected from metal nitride, metal oxide, metal carbide, silicon nitride, silicon oxide, silicon carbide, and combinations thereof. In some embodiments, the metal may be selected from aluminum (Al), zirconium (Zr), yttrium (Y), hafnium (Hf), zinc (Zn), and combinations thereof. In some embodiments, the etch stop layer 70 and the mask layer 40 (see FIG. 2) are made of the same material. In other embodiments, the etch stop layer 70 and the mask layer 40 are made of different materials. The etch stop layer 70 may be formed by a suitable technique, such as CVD, PECVD, ALD, spin-on coating, electroless plating, or the like. In some embodiments, the etch stop layer 70 may have a thickness ranging from about 1 nm to about 10 nm.

Figure 9:
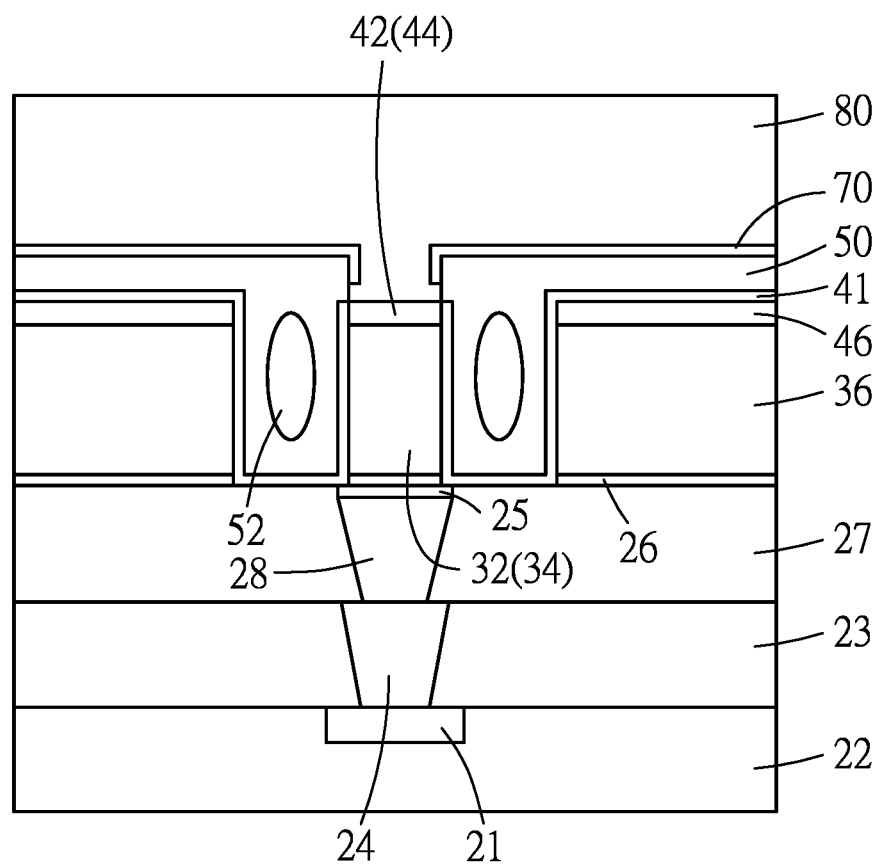

FIG. 9 illustrates that, after selective formation of the etch stop layer 70, the blocking layer 60 (see FIG. 8) is removed to expose the first mask sub-layer 44. This process is illustrated as process 222 in the flow chart 200 shown in FIG. 1. In some embodiments, the blocking layer 60 may be removed by a suitable process, such as heating, plasma dry etching (e.g., plasma containing $H_2$, $N_2$, $NH_3$, $O_2$, $C_xF_x$, or the like), wet etching (e.g., acid etching), or the like.

FIG. 9 also illustrates that, after removal of the blocking layer 60 (see FIG. 8), a second dielectric layer 80 is formed on the etch stop layer 70 and extends into the opening 71 in the etch stop layer 70 (see FIG. 8) and the opening 51 in the first dielectric layer 50 (see FIG. 7) so as to cover the etch stop layer 70 and the first mask sub-layer 44 of the patterned mask layer 42. This process is illustrated as process 224 in the flow chart 200 shown in FIG. 1. In some embodiments, the second dielectric layer 80 includes USG, PSG, BSG, BPSG, FSG, $SiO_2$, SiOC-based materials (e.g., SiOCH), or the like. In some embodiments, silicon dioxide may be formed from TEOS. The second dielectric layer 80 may be formed using a suitable technique, such as spin-on coating, FCVD, PECVD, LPCVD, ALD, or the like. In some embodiments, before the formation of the second dielectric layer 80, the first mask sub-layer 44 may be removed by suitable etching techniques, such as wet etching with etchant containing $H_2O_2$ or the like.

Figure 10:
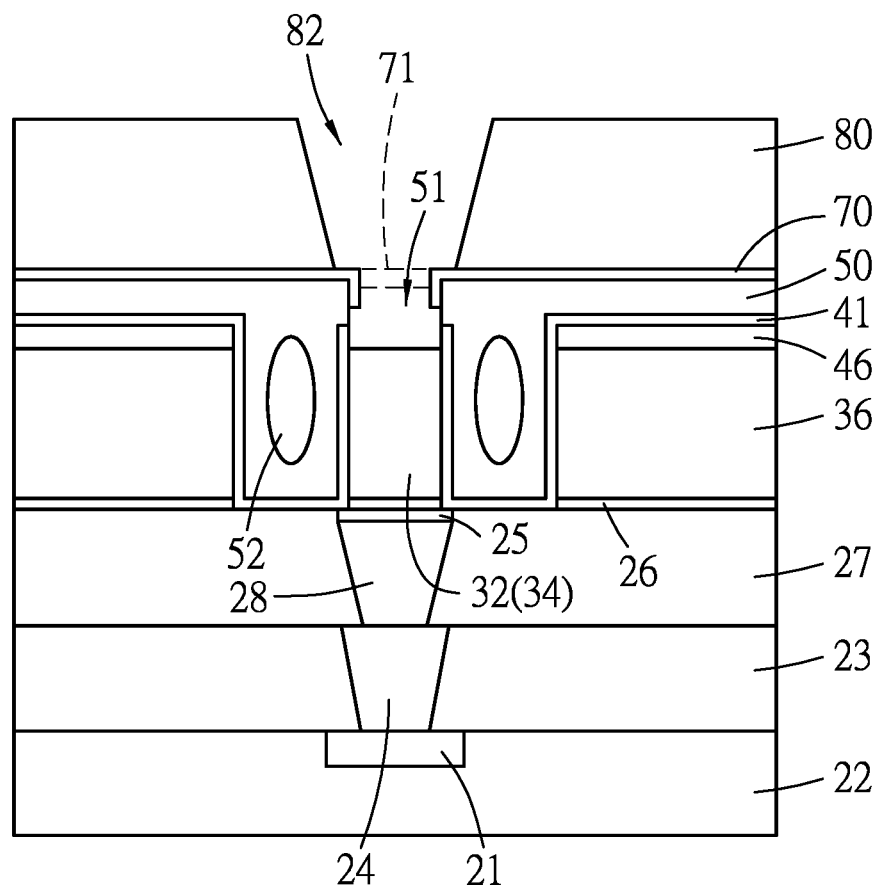

FIG. 10 illustrates that, after formation of the second dielectric layer 80, the second dielectric layer 80 is patterned to form a through hole 82 (i.e., to form a patterned second dielectric layer 80). The through hole 82 is spatially communicated with the opening 51 in the first dielectric layer 50 and the opening 71 in the etch stop layer 70 so that the first mask sub-layer 44 of the patterned mask layer 42 (see FIG. 9) is exposed from the through hole 82. This process is illustrated as process 226 in the flow chart 200 shown in FIG. 1. In some embodiments, the etch stop layer 70 serves as a mask for patterning a portion of the first dielectric layer 50 in the opening 51. In some embodiments, the second dielectric layer 80 may be etched by suitable techniques, such as plasma dry etching (e.g., plasma containing $H_2$, $N_2$, $NH_3$, $O_2$, $C_xF_x$, or the like).

FIG. 10 also illustrates that, after formation of the through hole 82, the first mask sub-layer 44 of the patterned mask layer 42 (see FIG. 9) is removed to expose the first conductive feature 34. This process is illustrated as process 228 in the flow chart 200 shown in FIG. 10. In some embodiments, the first mask sub-layer 44 may be removed by suitable etching techniques, such as wet etching with etchant containing $H_2O_2$ or the like.

Figure 11:
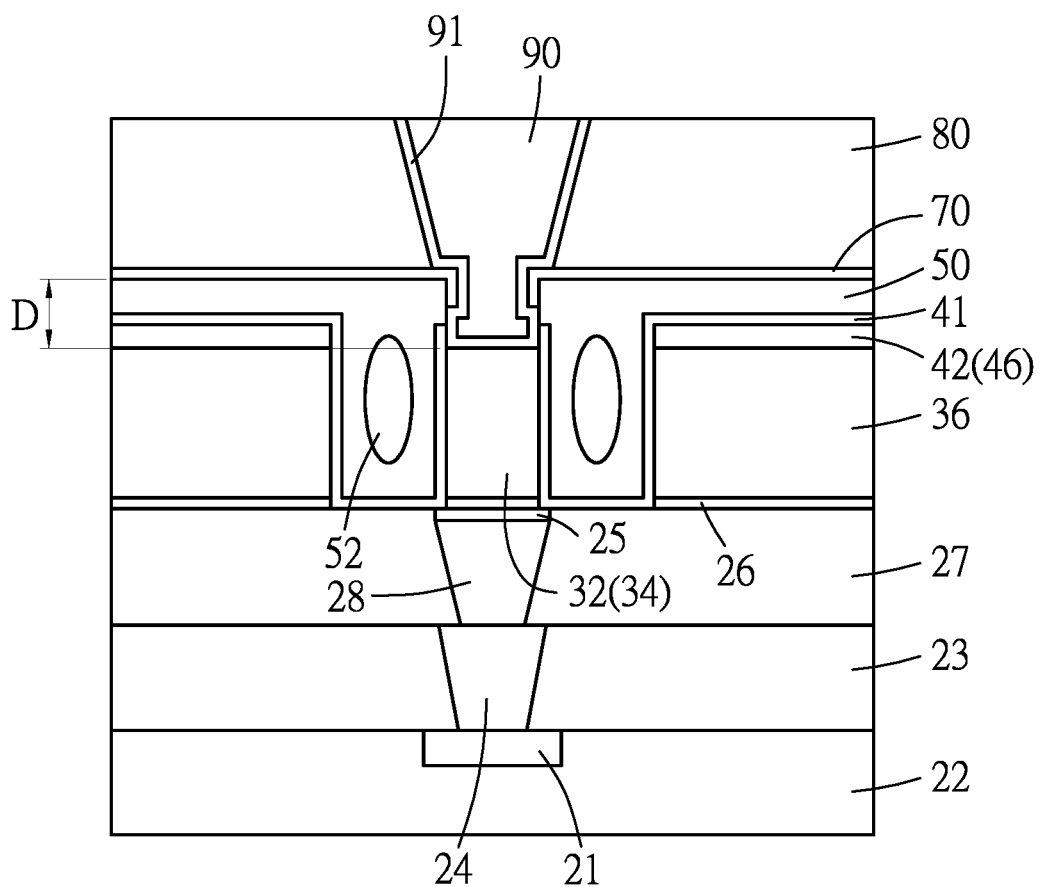

FIG. 11 illustrates that, after removal of the first mask sub-layer 44 (see FIG. 9), the through hole 82 (see FIG. 10), the opening 71 in the etch stop layer 70 (see FIG. 10) and the opening 51 in the dielectric layer 50 (see FIG. 10) are filled with an electrically conductive material to form an interconnect 90 which is electrically connected to the first conductive feature 34. This process is illustrated as process 230 in the flow chart 200 shown in FIG. 1. In some embodiments, the interconnect 90 is a metal layer, and may be made of Cu, Co, W, Ru, Mo, Al, or the like. In some embodiments, the interconnect 90 may be formed by PVD, CVD, ALD, ELD, a combination of PVD and ECP, or the like. In some embodiments, before the formation of the interconnect 90, a barrier/liner layer 91 may be formed. In some embodiments, the barrier/liner layer 91 includes a barrier, a liner, or a barrier and a liner. In some embodiments, the barrier/liner layer 91 may include TaN, TiN, Ru, MnN, ZnO, MoN, Ta, Ti, Co, Ru, combinations thereof, or the like.

As shown in FIG. 11, in accordance with some embodiments, the etch stop layer 70 is separated from the patterned conductive layer 32 by a distance (D), which may range from about 2 nm to about 10 nm.

Figure 12:
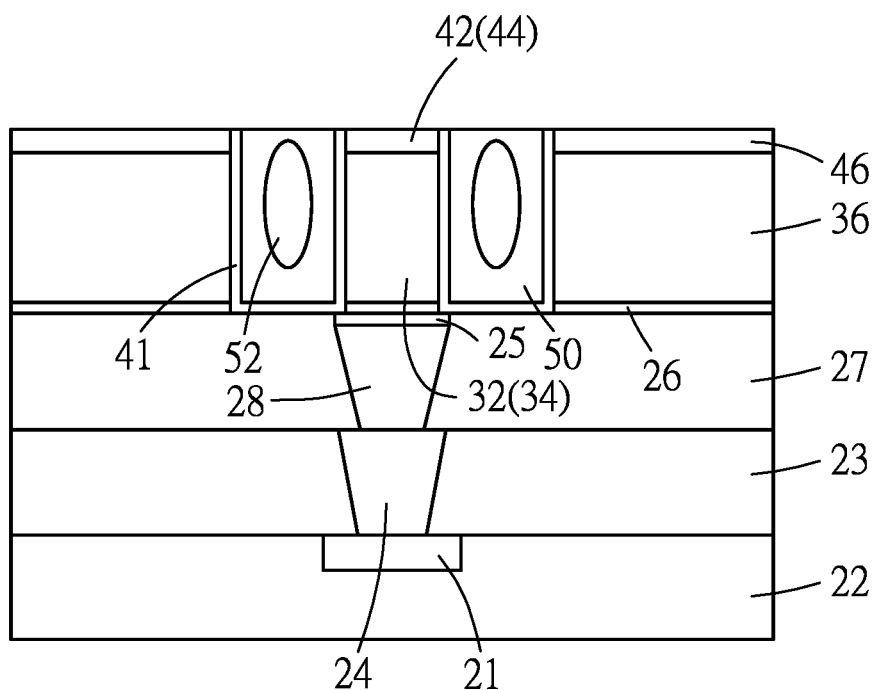
FIGS. 12 through 18 illustrate schematic views of stages in the formation of a semiconductor structure in accordance with some embodiments.

Referring to FIG. 12, in accordance with some embodiments, the process of patterning the first dielectric layer 50 (i.e., process 216 in the flow chart 200 as shown in FIG. 1) involves patterning the first dielectric layer 50 in such a manner that both of the first mask sub-layer 44 and the second mask sub-layer 46 of the patterned mask layer 42 are exposed. In other words, the first dielectric layer 50 aligned with the first and second conductive features 34, 36 is removed to expose the patterned mask layer 42 on the first and second conductive features 34, 36. The patterning may be done by a suitable etch technique, such as plasma dry etch, chemical mechanical polish (CMP), or the like.

Figure 13:
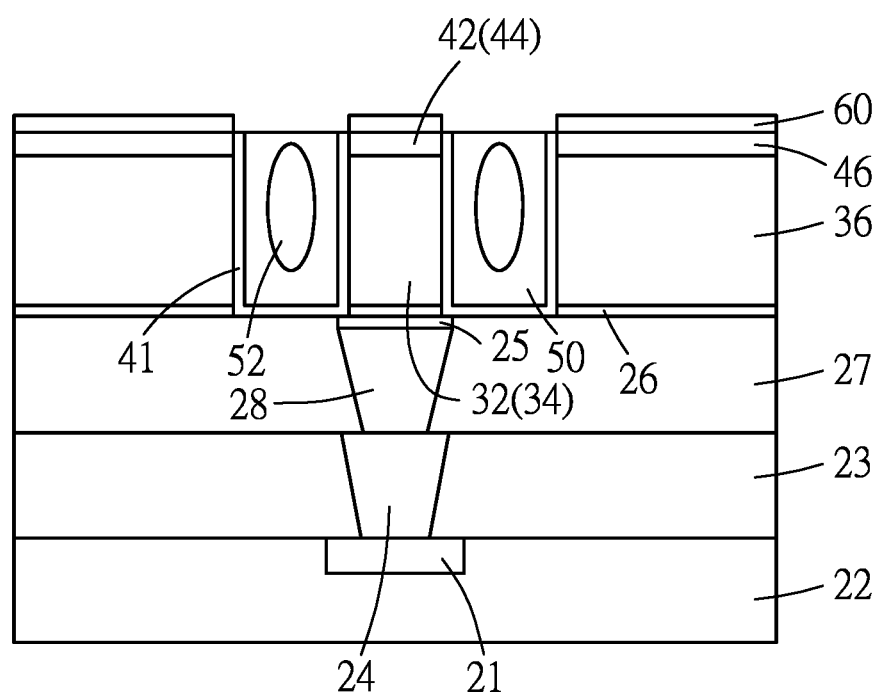

Referring to FIG. 13, in accordance with some embodiments, the process of forming the blocking layer 60 (i.e., process 218 in the flow chart 200 as shown in FIG. 1) involves forming the blocking layer 60 on the first mask sub-layer 44 and the second mask sub-layer 46 of the patterned mask layer 42 and not on the first dielectric layer 50. In some embodiments, the blocking layer 60 may be formed from a self-assembling monolayer (SAM) material including a head group which contains phosphorus (P) or sulfur (S). In some embodiments, the head group of SAM may include phosphate or sulfate. In some embodiments, SAM may include BTA, phosphonic acid, ODPA, organosulfur compound, thiol (e.g., dodecanethiol, alkanethiol, or the like), or the like. In some embodiments, SAM further includes a tail group which is connected to the head group and which contains an organic chain, such as CHx or the like. In some embodiments, SAM may react with the hydroxyl group on the surface of the first mask sub-layer 44 and the second mask sub-layer 46 to be selectively formed on the first mask sub-layer 44 and the second mask sub-layer 46, and not formed on the first dielectric layer 50. The blocking layer 60 may be formed by a suitable technique, such as ALD, CVD, spin-on coating, dipping, or the like.

Figure 14:
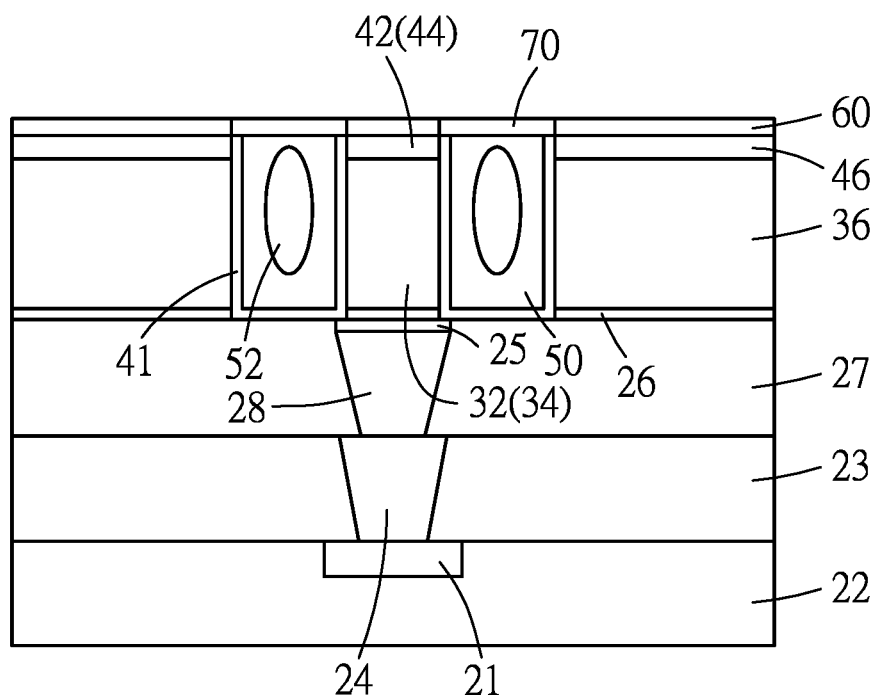

Referring to FIG. 14, in accordance with some embodiments, the process of forming the etch stop layer 70 (i.e., the process 220 in the flow chart 200 as shown in FIG. 1) involves selectively forming the etch stop layer 70 on the first dielectric layer 50 and not on the blocking layer 60. In some embodiments, the head group of SAM is configured to be hydrophilic, and the tail group of SAM is configured to be hydrophobic, which blocks absorption of a precursor on the SAM, thereby preventing the etch stop layer 70 from forming on the blocking layer 60. In some embodiments, the etch stop layer 70 has a horizontal cross section that is complementary in shape to that of the blocking layer 60. In some embodiments, horizontal cross sections of the blocking layer 60 on the first mask sub-layer 44 of the patterned mask layer 42, the first mask sub-layer 44 and the first conductive feature 34 of the patterned conductive layer 32 are substantially the same. In some embodiments, the etch stop layer 70 may be made of a material selected from metal nitride, metal oxide, metal carbide, silicon nitride, silicon oxide, silicon carbide, and combinations thereof. In some embodiments, the metal is selected from aluminum (Al), zirconium (Zr), yttrium (Y), hafnium (Hf), zinc (Zn), and combinations thereof. The etch stop layer 70 may be formed by a suitable technique, such as CVD, PECVD, ALD, spin-on coating, electroless plating, or the like. In some embodiments, the etch stop layer 70 may have a thickness ranging from about 1 nm to about 100 nm.

Figure 15:
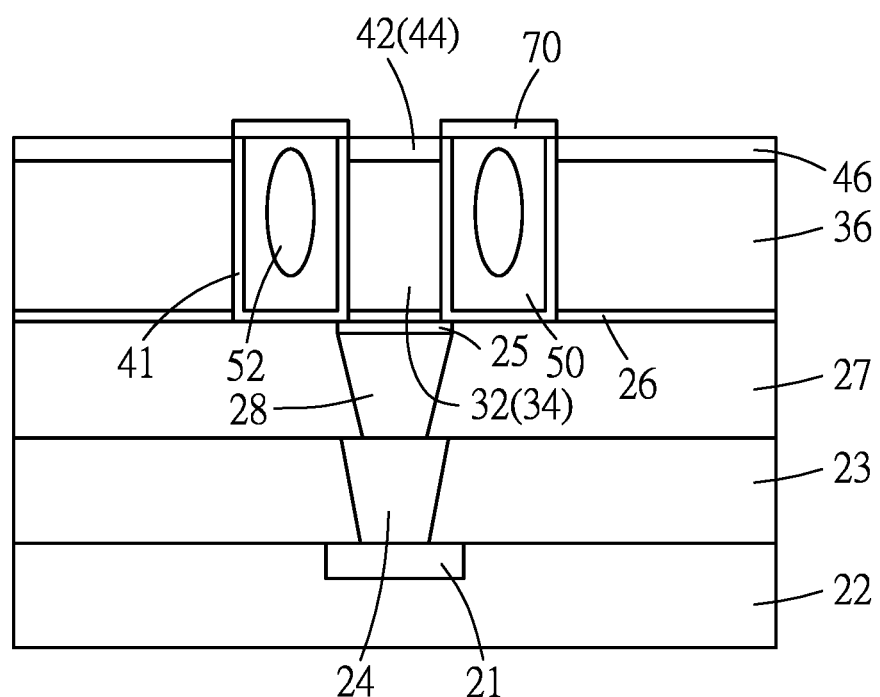

Referring to FIG. 15, in accordance with some embodiments, the process of removing the blocking layer 60 (see FIG. 14) (i.e., the process 222 in the flow chart 200 as shown in FIG. 1) involves removing the blocking layer 60 such that the first mask sub-layer 44 and the second mask sub-layer 46 of the patterned mask layer 42 are exposed. In other words, the blocking layer 60 aligned with the first and second conductive features 34, 36 is removed to expose the patterned mask layer 42 on the first and second conductive features 34, 36. In some embodiments, the blocking layer 60 may be removed by a suitable process, such as heating, plasma dry etching (e.g., plasma containing $H_2$, $N_2$, $NH_3$, $O_2$, $C_xF_x$, or the like), wet etching (e.g., acid etching), or the like.

Figure 16:
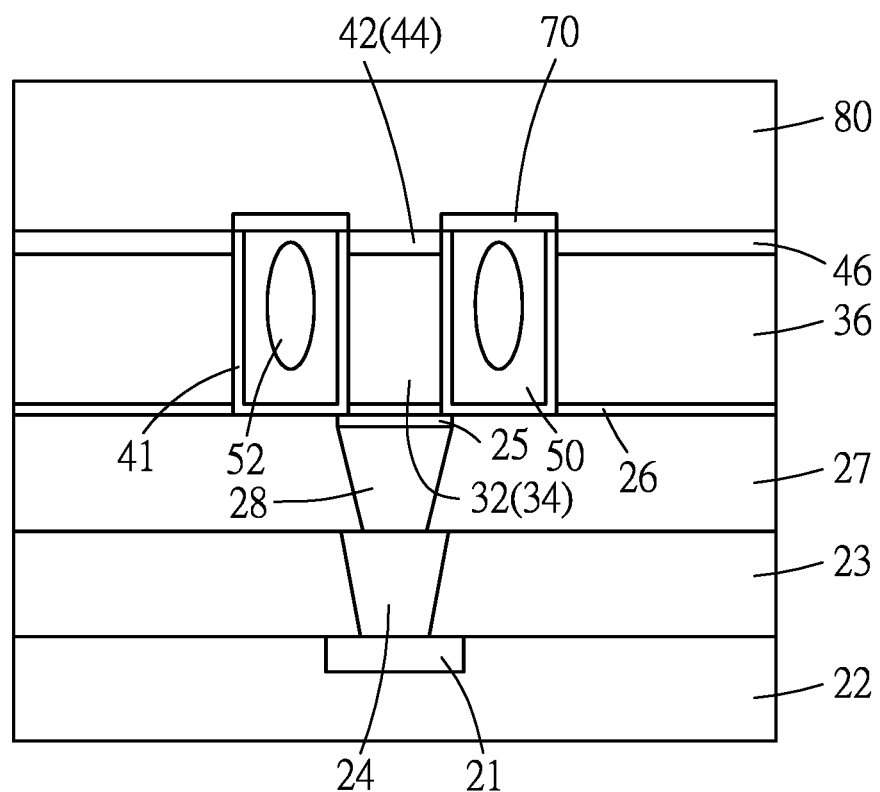

Referring to FIG. 16, in accordance with some embodiments, the process of forming the second dielectric layer 80 (i.e., process 224 in the flow chart 200 as shown in FIG. 1) involves forming the second dielectric layer 80 to cover the first mask sub-layer 44 and the second mask sub-layer 46 of the patterned mask layer 42, and the etch stop layer 70. In some embodiments, the second dielectric layer 80 includes USG, PSG, BSG, BPSG, FSG, $SiO_2$, SiOC-based materials (e.g., SiOCH), or the like. In some embodiments, silicon dioxide may be formed from TEOS. The second dielectric layer 80 may be formed using a suitable technique, such as spin-on coating, FCVD, PECVD, LPCVD, ALD, or the like.

Figure 17:
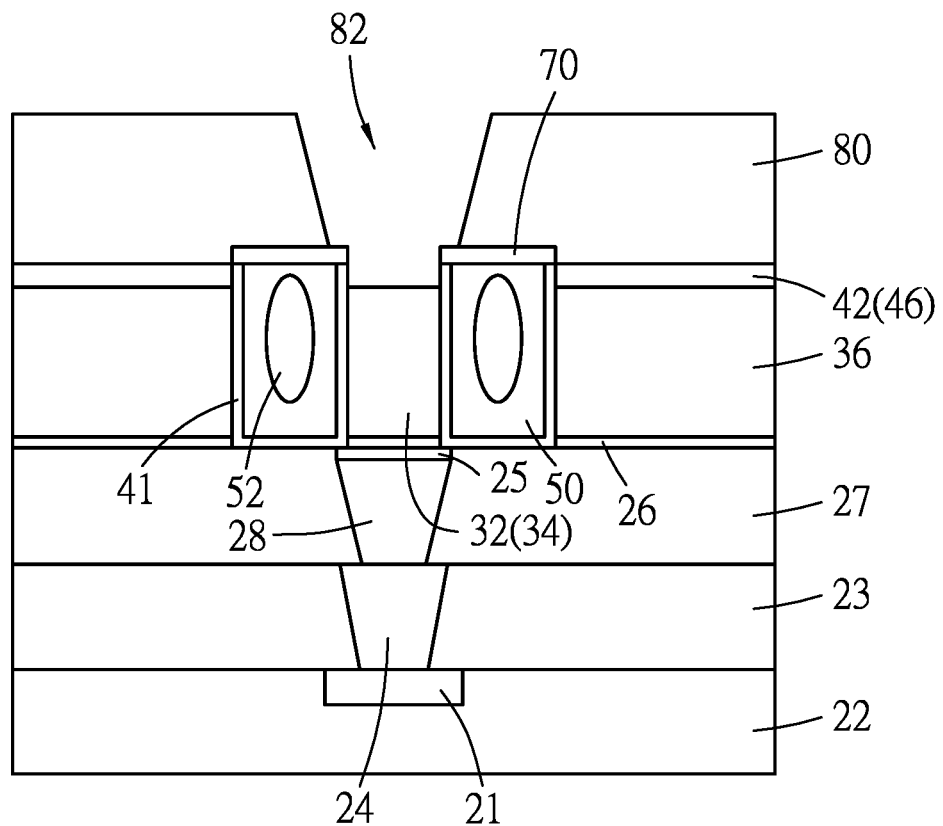

Referring to FIG. 17, in accordance with some embodiments, the process of patterning the second dielectric layer 80 (i.e., process 226 in the flow chart 200 as shown in FIG. 1) involves patterning the second dielectric layer 80 to form the through hole 82 from which the first mask sub-layer 44 of the patterned mask layer 42 (see FIG. 16) is exposed. In some embodiments, after the second dielectric layer 80 is patterned, the first mask sub-layer 44 of the patterned mask layer 42 is removed to expose the first conductive feature 34, while the second mask sub-layer 46 of the patterned mask layer 42 is still covered by the second dielectric layer 80.

Figure 18:
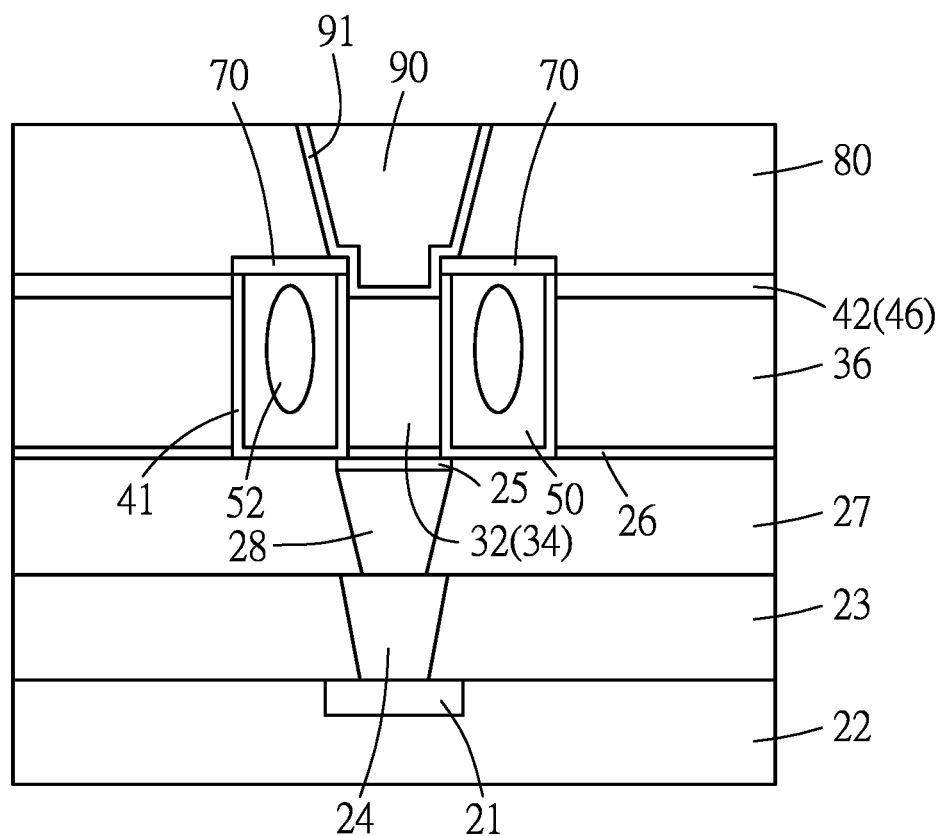

Referring to FIG. 18, in accordance with some embodiments, the process of forming the interconnect 90 (i.e., process 230 in the flow chart 200 as shown in FIG. 1) involves filling the through hole 82 (see FIG. 17) with an electrically conductive material to form the interconnect 90 so that the interconnect 90 is in contact with and is electrically connected to the first conductive feature 34. In some embodiments, the interconnect 90 is a metal layer, and may be made of Cu, Co, W, Ru, Mo, Al, or the like. In some embodiments, the interconnect 90 may be formed by PVD, CVD, ALD, ELD, a combination of PVD and ECP, or the like. In some embodiments, before the formation of the interconnect 90, the barrier/liner layer 91 may be formed. In some embodiments, the barrier/liner layer 91 includes a barrier, a liner, or a barrier and a liner. In some embodiments, the barrier/liner layer 91 may include TaN, TiN, Ru, MnN, ZnO, MoN, Ta, Ti, Co, Ru, combinations thereof, or the like.

Figure 19:
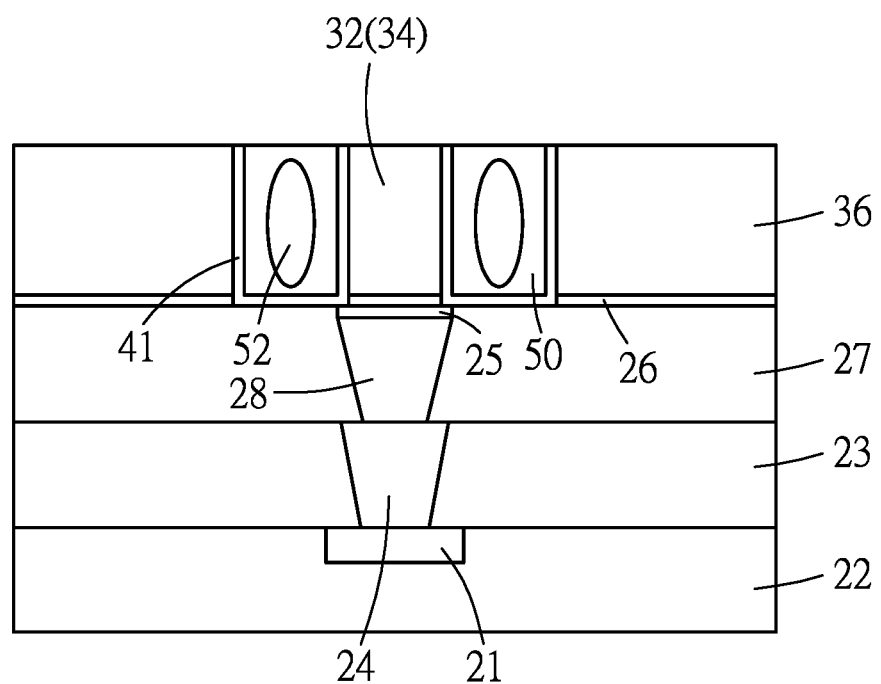
FIGS. 19 through 23 illustrate schematic views of stages in the formation of a semiconductor structure in accordance with some embodiments.

Referring to FIG. 19, in accordance with some embodiments, the process of patterning the first dielectric layer 50 (i.e., process 216 in the flow chart 200 as shown in FIG. 1) involves patterning the first dielectric layer 50 in such a manner that both of the first mask sub-layer 44 and the second mask sub-layer 46 of the patterned mask layer 42 (see FIG. 5) are removed and that the first and second conductive features 34, 36 are exposed. The patterning may be done by a suitable etch technique, such as plasma dry etch, CMP, or the like.

Figure 20:
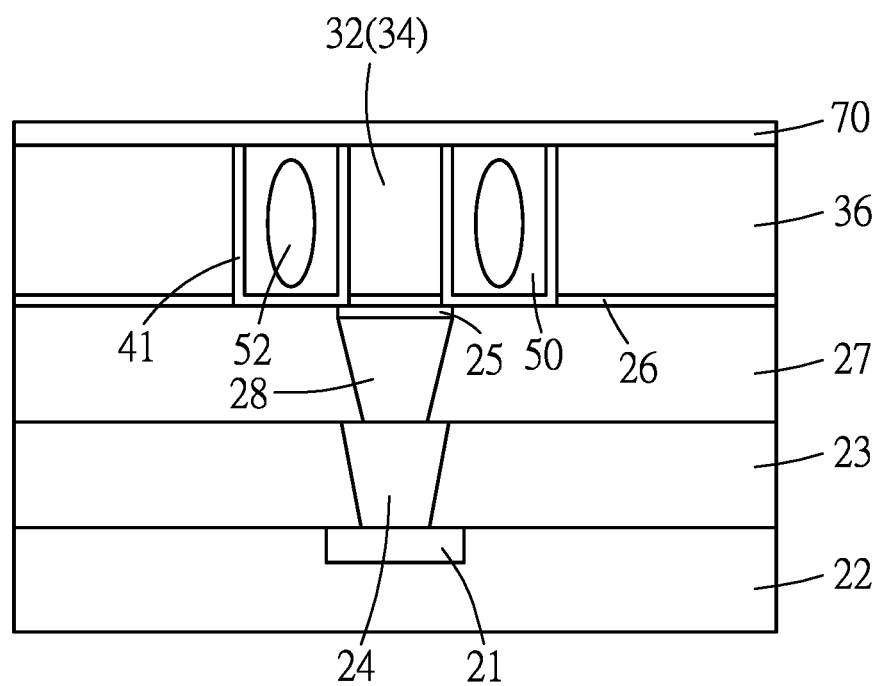

Referring to FIG. 20, after the patterning step, the process of forming the etch stop layer 70 (i.e., the process 220 in the flow chart 200 as shown in FIG. 1) may be conducted. In some embodiments, the etch stop layer 70 is formed to cover the first dielectric layer 50 and the first and second conductive features 34, 36. In some embodiments, the etch stop layer 70 may be made of a material selected from metal nitride, metal oxide, metal carbide, silicon nitride, silicon oxide, silicon carbide, and combinations thereof. In some embodiments, the metal is selected from aluminum (Al), zirconium (Zr), yttrium (Y), hafnium (Hf), zinc (Zn), and combinations thereof. The etch stop layer 70 may be formed by a suitable technique, such as CVD, PECVD, ALD, spin-on coating, electroless plating, or the like. In some embodiments, the etch stop layer 70 may have a thickness ranging from about 1 nm to about 100 nm.

Figure 21:
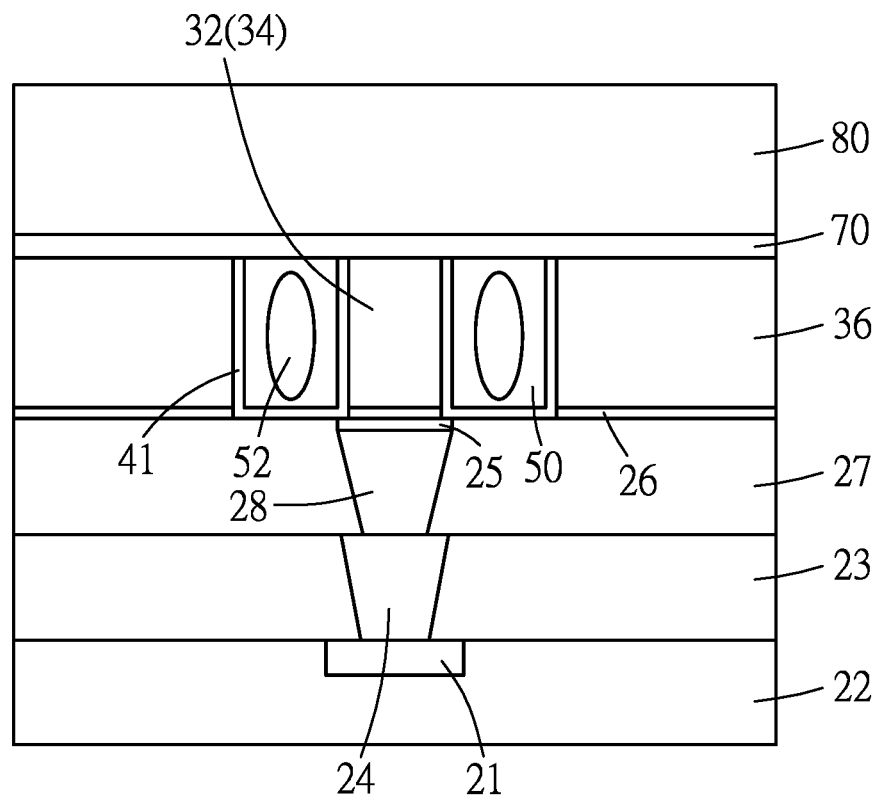

Referring to FIG. 21, after the formation of the etch stop layer 70, the process of forming the second dielectric layer 80 (i.e., process 224 in the flow chart 200 as shown in FIG. 1) may be conducted. In some embodiments, the second dielectric layer 80 may be formed to cover the etch stop layer 70. In some embodiments, the second dielectric layer 80 includes USG, PSG, BSG, BPSG, FSG, $SiO_2$, SiOC-based materials (e.g., SiOCH), or the like. In some embodiments, silicon dioxide may be formed from TEOS. The second dielectric layer 80 may be formed using a suitable technique, such as spin-on coating, FCVD, PECVD, LPCVD, ALD, or the like.

Figure 22:
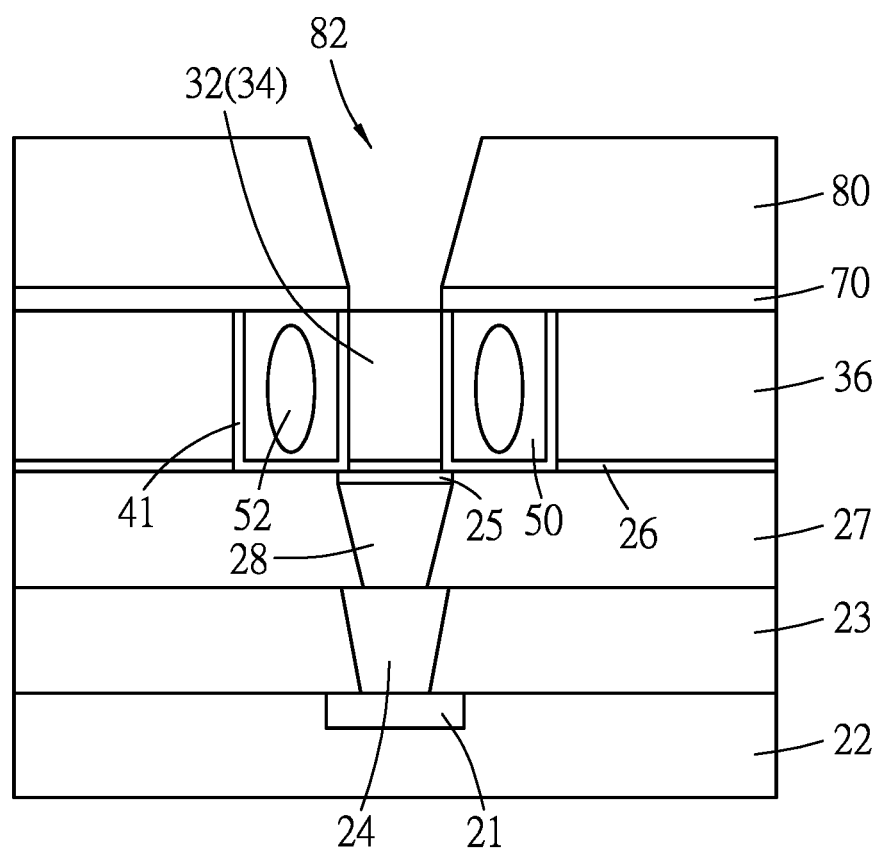

Referring to FIG. 22, after the formation of the second dielectric layer 80, the process of patterning the second dielectric layer 80 (i.e., process 226 in the flow chart 200 as shown in FIG. 1) may be conducted. In some embodiments, both the second dielectric layer 80 and the etch stop layer 70 may be patterned to form the through hole 82. In some embodiments, the second dielectric layer 80 may be etched by suitable techniques, such as plasma dry etching (e.g., plasma containing $H_2$, $N_2$, $NH_3$, $O_2$, $C_xF_x$, or the like). In some embodiments, the etch stop layer 70 may be patterned by suitable techniques, such as wet etching (e.g., acid etching), or the like.

Figure 23:
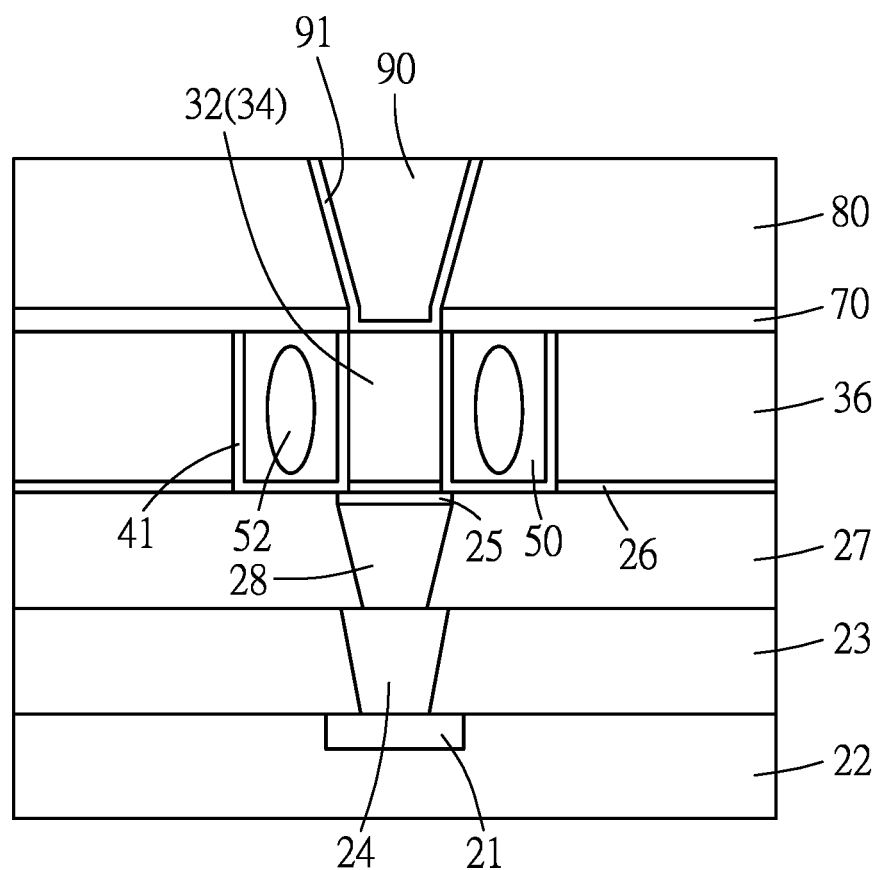

Referring to FIG. 23, after the patterning of the second dielectric layer 80 and the etch stop layer 70, the process of forming the interconnect 90 (i.e., process 230 in the flow chart 200 as shown in FIG. 1) may be conducted. In some embodiments, the through hole 82 (see FIG. 22) may be filled with an electrically conductive material to form the interconnect 90 so that the interconnect 90 is electrically connected to the first conductive feature 34. In some embodiments, the interconnect 90 is a metal layer, and may be made of Cu, Co, W, Ru, Mo, Al, or the like. In some embodiments, the interconnect 90 may be formed by PVD, CVD, ALD, ELD, a combination of PVD and ECP, or the like. In some embodiments, before the formation of the interconnect 90, the barrier/liner layer 91 may be formed. In some embodiments, the barrier/liner layer 91 includes a barrier, a liner, or a barrier and a liner. In some embodiments, the barrier/liner layer 91 may include TaN, TiN, Ru, MnN, ZnO, MoN, Ta, Ti, Co, Ru, combinations thereof, or the like.

The embodiments of the present disclosure have some advantageous features. By selectively forming the blocking layer on the first mask sub-layer and not on the first dielectric layer, the etch stop layer can be accurately formed on the first dielectric layer and not on the blocking layer. The etch stop layer thus formed already has a desired pattern and an etching process is not required to be performed thereon, so that possible overlay shift between the through hole and the first conductive feature may be eliminated. Therefore, certain issues associated with overlay shift, such as time-dependent gate oxide breakdown (TDDB) or over-etching into the underlying dielectric may be avoided. In accordance with some embodiments, the etch stop layer with higher dielectric constant is separated from the patterned conductive layer, resulting in a structure with lower capacitance, thereby reducing the RC time constant of the semiconductor structure.

In accordance with some embodiments, a method for making a semiconductor structure includes: providing a substrate with a conductive structure thereon; forming a conductive layer on the substrate; forming a patterned mask layer on the conductive layer; patterning the conductive layer using the patterned mask layer as a mask to form a patterned conductive layer that includes a conductive feature and a recess adjoining the conductive feature, the conductive feature being electrically connected to the conductive structure; forming a first dielectric layer over the patterned mask layer and filling the recess with the first dielectric layer; patterning the first dielectric layer to form an opening; selectively forming a blocking layer in the opening over the conductive feature; forming an etch stop layer to cover the first dielectric layer and exposing the blocking layer; forming a second dielectric layer on the etch stop layer; patterning the second dielectric layer to form a through hole and exposing the conductive feature; and filling the through hole with an electrically conductive material to form an interconnect which is electrically connected to the conductive feature.

In accordance with some embodiments, a method for making a semiconductor structure includes: providing a substrate with a conductive structure thereon; forming a metal layer on the substrate; forming a mask layer on the metal layer; patterning the mask layer to form a patterned mask layer; patterning the metal layer using the patterned mask layer as a mask to form a patterned metal layer that includes a first conductive feature and a recess adjoining the first conductive feature, the first conductive feature being covered by the patterned mask layer and being electrically connected to the conductive structure; covering the patterned mask layer with a first dielectric layer and filling the recess with the first dielectric layer; patterning the first dielectric layer to expose the patterned mask layer on the first conductive feature; selectively covering the patterned mask layer on the first conductive feature with a self-assembling monolayer material to form a blocking layer on the patterned mask layer disposed on the first conductive feature; forming an etch stop layer to cover the first dielectric layer and exposing the blocking layer; removing the blocking layer to expose the patterned mask layer on the first conductive feature; forming a second dielectric layer to cover the etch stop layer and the patterned mask layer on the first conductive feature; patterning the second dielectric layer to form a through hole from which the patterned mask layer on the first conductive feature is exposed; removing the patterned mask layer on the first conductive feature to expose the first conductive feature; and filling the through hole with an electrically conductive material to form an interconnect which is electrically connected to the first conductive feature.

In accordance with some embodiments, a semiconductor structure includes a substrate with a conductive structure thereon, a conductive layer, an interconnect, a first dielectric layer, a second dielectric layer, and an etch stop layer. The conductive layer is disposed on the substrate, and includes a first conductive feature. The first conductive feature is electrically connected to the conductive structure. The interconnect is electrically connected to the first conductive feature. The first dielectric layer adjoins the first conductive feature. The second dielectric layer is disposed on the first dielectric layer and adjoins the interconnect. The etch stop layer is disposed between the first dielectric layer and the second dielectric layer, and surrounds a portion of the interconnect. The etch stop layer is separate from the conductive layer by the first dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for making a semiconductor structure, comprising:
    providing a substrate with a conductive structure thereon;
    forming a conductive layer on the substrate;
    forming a patterned mask layer on the conductive layer;
    patterning the conductive layer by using the patterned mask layer as a mask to form a patterned conductive layer that includes a conductive feature and a recess adjoining the conductive feature, the conductive feature being electrically connected to the conductive structure;
    forming a first dielectric layer over the patterned mask layer and filling the recess with the first dielectric layer;
    patterning the first dielectric layer to form an opening;
    selectively forming a blocking layer in the opening over the conductive feature;
    after forming the blocking layer, forming an etch stop layer to cover the first dielectric layer and exposing the blocking layer;
    removing the blocking layer after forming the etch stop layer;
    forming a second dielectric layer on the etch stop layer;
    patterning the second dielectric layer to form a through hole and exposing the conductive feature; and
    filling the through hole with an electrically conductive material to form an interconnect which is electrically connected to the conductive feature.

2. The method as claimed in claim 1, wherein, in forming the etch stop layer, the etch stop layer is formed to be separated from the patterned conductive layer by the first dielectric layer.

3. The method as claimed in claim 2, wherein the etch stop layer is separated from the patterned conductive layer by a distance ranging from 2 nm to 10 nm.

4. The method as claimed in claim 1, wherein the etch stop layer has a horizontal cross section that is complementary in shape to that of the blocking layer.

5. The method as claimed in claim 1, wherein the blocking layer is made of a self-assembling monolayer material that includes a head group containing phosphorus, sulfur, or a combination thereof.

6. The method as claimed in claim 5, wherein the head group of the self-assembling monolayer material includes phosphonic acid, thiol, benzotriazole, or combinations thereof.

7. A method for making a semiconductor structure, comprising:
    providing a substrate with a conductive structure thereon;
    forming a metal layer on the substrate;
    forming a mask layer on the metal layer;
    patterning the mask layer to form a patterned mask layer;
    patterning the metal layer by using the patterned mask layer as a mask to form a patterned metal layer that includes a first conductive feature and a recess adjoining the first conductive feature, the first conductive feature being covered by the patterned mask layer and being electrically connected to the conductive structure;
    covering the patterned mask layer with a first dielectric layer and filling the recess with the first dielectric layer;
    patterning the first dielectric layer to expose the patterned mask layer on the first conductive feature;
    selectively covering the patterned mask layer on the first conductive feature with a self-assembling monolayer material to form a blocking layer on the patterned mask layer disposed on the first conductive feature;

forming an etch stop layer to cover the first dielectric layer and exposing the blocking layer;
removing the blocking layer to expose the patterned mask layer on the first conductive feature;
forming a second dielectric layer to cover the etch stop layer and the patterned mask layer on the first conductive feature;
patterning the second dielectric layer to form a through hole from which the patterned mask layer on the first conductive feature is exposed;
removing the patterned mask layer on the first conductive feature to expose the first conductive feature; and
filling the through hole with an electrically conductive material to form an interconnect which is electrically connected to the first conductive feature.

8. The method as claimed in claim 7, wherein:
the patterned metal layer further includes a second conductive feature that adjoins the recess, that is separated from the first conductive feature, and that is covered by the patterned mask layer; and
in patterning the first dielectric layer, the patterned mask layer on the second conductive feature is not exposed from the first dielectric layer.

9. The method as claimed in claim 7, wherein:
the patterned metal layer further includes a second conductive feature that adjoins the recess, that is separated from the first conductive feature, and that is covered by the patterned mask layer;
in patterning the first dielectric layer, the first dielectric layer aligned with the second conductive feature is removed to expose the patterned mask layer on the second conductive feature;
in the selective covering step, the blocking layer is formed on the patterned mask layer on the second conductive feature;
in removing the blocking layer, the blocking layer aligned with the second conductive feature is removed to expose the patterned mask layer on the second conductive feature; and
in forming the second dielectric layer, the patterned mask layer on the second conductive feature is covered by the second dielectric layer.

10. The method as claimed in claim 7, wherein, in forming the etch stop layer, the etch stop layer is formed to be separated from the patterned metal layer by the first dielectric layer.

11. The method as claimed in claim 10, wherein the etch stop layer is separated from the patterned metal layer by a distance ranging from 2 nm to 10 nm.

12. The method as claimed in claim 7, wherein the etch stop layer has a horizontal cross section that is complementary in shape to that of the blocking layer.

13. The method as claimed in claim 7, wherein the blocking layer is made of a self-assembling monolayer material that includes a head group including phosphorus, sulfur, or combinations thereof.

14. The method as claimed in claim 13, wherein the head group of the self-assembling monolayer material includes phosphonic acid, thiol, benzotriazole, or combinations thereof.

15. A method for making a semiconductor structure, comprising:
providing a substrate with a conductive structure thereon;
forming a conductive layer disposed on the substrate, the conductive layer including a first conductive feature, the first conductive feature being electrically connected to the conductive structure;
forming a first dielectric layer adjoining the first conductive feature;
patterning the first dielectric layer to form an opening;
selectively forming a blocking layer in the opening over the first conductive feature;
after forming the blocking layer, forming an etch stop layer over the blocking layer to cover the first dielectric layer and exposing the blocking layer;
removing the blocking layer after forming the etch stop layer;
forming a second dielectric layer on the etch stop layer; and
forming an interconnect in the second dielectric layer, the interconnect being electrically connected to the first conductive feature.

16. The method as claimed in claim 15, wherein:
the conductive layer further includes a second conductive feature that is separated from the first conductive feature by the first dielectric layer; and
the method further comprises forming a mask layer disposed on and in direct contact with the second conductive feature.

17. The method as claimed in claim 15, wherein the etch stop layer has a first sub-layer that is formed on a top surface of the first dielectric layer, and a second sub-layer that is formed on an inner lateral side of the first dielectric layer.

18. The method as claimed in claim 15, wherein the etch stop layer is separated from the first conductive feature of the conductive layer by a distance ranging from 2 nm to 10 nm.

19. The method as claimed in claim 15, wherein:
the etch stop layer is made of a material selected from metal nitride, metal oxide, metal carbide, silicon nitride, silicon oxide, silicon carbide, and combinations thereof; and
the metal is selected from aluminum, zirconium, yttrium, hafnium, zinc, and combinations thereof.

20. The method as claimed in claim 15, wherein the etch stop layer has a horizontal cross section that is complementary in shape to that of the first conductive feature.

* * * * *